(12) United States Patent
Hsu

(10) Patent No.: US 7,002,870 B2
(45) Date of Patent: Feb. 21, 2006

(54) SPEEDING UP THE POWER-UP PROCEDURE FOR LOW POWER RAM

(75) Inventor: Jen-Shou Hsu, Tainan (TW)

(73) Assignee: Etron Technology, Inc., Hsin-Chu (TW)

( * ) Notice: Subject to any disclaimer, the term of this patent is extended or adjusted under 35 U.S.C. 154(b) by 39 days.

(21) Appl. No.: 10/861,162

(22) Filed: Jun. 4, 2004

(65) Prior Publication Data

US 2005/0270881 A1 Dec. 8, 2005

(51) Int. Cl.
*G11C 7/00* (2006.01)
(52) U.S. Cl. ............................. 365/227; 365/226
(58) Field of Classification Search ................. 365/226, 365/227, 228, 229
See application file for complete search history.

(56) References Cited

U.S. PATENT DOCUMENTS

| | | | |
|---|---|---|---|
| 5,617,062 A | 4/1997 | O'Shaughnessy et al. .. | 331/111 |
| 5,640,083 A | 6/1997 | Alexis ......................... | 323/313 |
| 5,894,446 A * | 4/1999 | Itou ............................. | 365/222 |
| 6,256,252 B1 * | 7/2001 | Arimoto ....................... | 365/227 |
| 6,667,642 B1 | 12/2003 | Moyal ......................... | 327/156 |
| 6,868,026 B1 * | 3/2005 | Fujioka ....................... | 365/222 |

* cited by examiner

*Primary Examiner*—Son Mai
(74) *Attorney, Agent, or Firm*—George O. Saile; Stephen B. Ackerman

(57) ABSTRACT

An internal power system for a low power memory chip is described that provides a large capacity internal power source during chip power up and during an active state whereby memory operations are carried out. A memory chip standby state allows reduced chip power where the large capacity power source is turned off, and the memory chip internal voltages are provided by a small capacity power source. Switching between the standby and active states of the low power memory chip is accomplished by turning on and off a standby signal. The internal and external chip voltages are monitored during chip power up to insure that predetermined voltage levels have been reached before turning off the large capacity power source and placing the chip into a standby state.

25 Claims, 2 Drawing Sheets

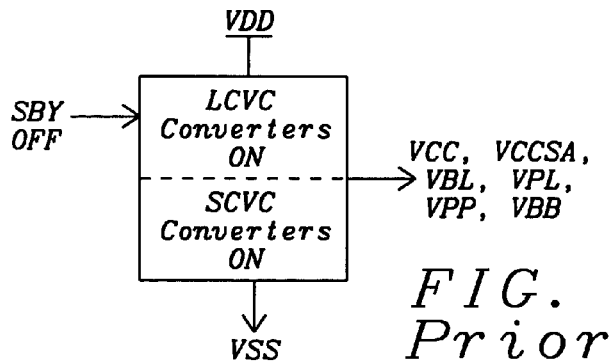
FIG. 1A – Prior Art
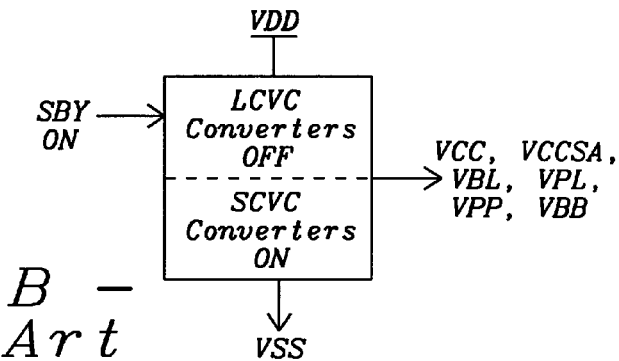
FIG. 1B – Prior Art
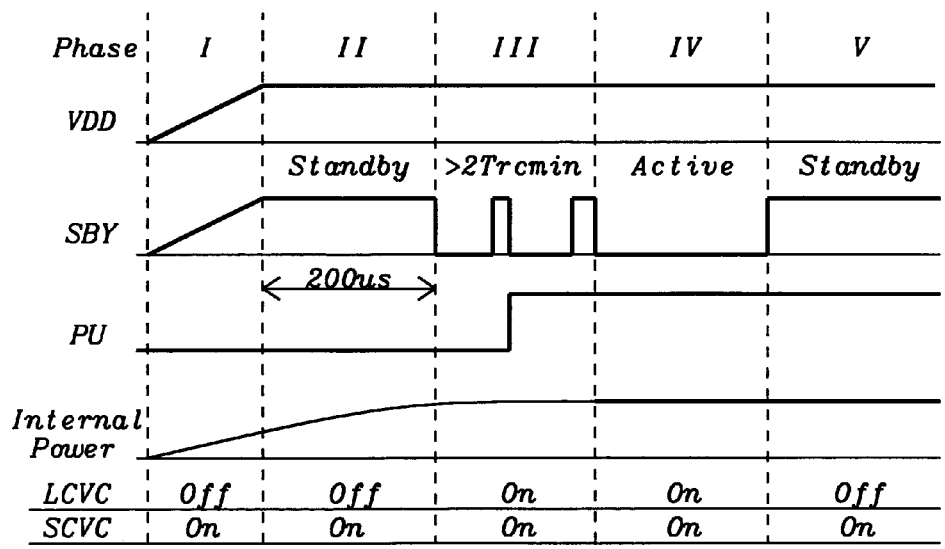
FIG. 2

SPEEDING UP THE POWER-UP PROCEDURE FOR LOW POWER RAM

BACKGROUND OF THE INVENTION

1. Field of Invention

The present invention relates to low power RAM and in particular the speed by which low power RAM is powered up and switched between standby and active states.

2. Description of Related Art

The popularity of portable devices has created a need for low power devices and in particular low power RAM, which can conserve power and at the same time provide a quick response to the request for data. Low power techniques are one of the keys to the advancement of portable devices. In low power memory devices the power-up procedure can be relatively slow, which is caused in part by waiting for the internal power circuits to be charged. To assist in charging the internal power circuitry, dummy cycles are used to permit time to charge the power circuits.

In the low power applications, the power consumption of a memory device (RAM) in an active mode versus a standby mode is divergent. In some low power RAM chips the power consumption in the active mode is two to three orders of magnitude larger than in standby mode. The internal power of a low power RAM is created with on-chip voltage generators, which consist of large and small voltage converters. The large voltage converters have a high capacity for supplying the required internal chip power, and also consume additional power in their operation. Both the large and small converters are turned on when the RAM chips operate in an active mode, i.e. read, write and auto refresh. In self refresh mode and standby mode only the small converters are used in low power RAM.

U.S. Pat. No. 5,617,062 (O'Shaughnessy) describes a timer initialization circuit, which has a rapid initialization on power-up. The circuit is used to stabilize a timing signal of a timed system using a core oscillator. The initialization circuit disables the core oscillator in a power down and re-enables the oscillator upon termination of the power down mode. In U.S. Pat. No. 5,640,083 (Alexis) a method and apparatus are described for improving the power up time of flash EEPROM memory arrays. The apparatus includes a circuit with a rapidly rise of the value of voltage at a circuit node, which includes connecting one of the charging circuits to a circuit node for a first limited period and then connecting another of the charging circuits to the circuit node thereafter. U.S. Pat. No. 6,667,642 (Moyal) discloses a method and circuit for reducing the power up time of a phase lock loop (PLL). In one embodiment, the invention cuts off a first voltage to the phase lock loop, thereby powering down the phase lock loop. In power down, a second voltage is utilized to maintain the power requirements of a filter node within the phase lock loop while the other components of the phase lock loop are powered down.

In FIG. 1A is shown a block diagram of prior art for the voltage generation within a low power memory chip when a standby signal SBY is off, and the memory chip is in an active state. Both the large capacity voltage converters LCVC and the small capacity voltage converters SCVC are in the on state. The converters are supplied with VDD, the memory chip power supply voltage, and VSS, the memory chip ground voltage. In the active state normal chip operations, such as read, write and refresh, are performed and require the large capacity voltage converters LCVC to be in the on state to supply the necessary energy to allow the memory chip to meet its specifications. The LCVC and SCVC converters produce various internal memory chip voltages, which include VCC the memory peripheral circuit power supply, VCCSA the sense amplifier power supply voltage, VBL the bit line voltage, VPL the memory cell plate voltage, VPP the word line voltage and VBB the memory substrate voltage.

In FIG. 1B is shown a block diagram of prior art for the voltage generation within a low power memory chip when a standby signal SBY is on, and the memory chip is in a standby state. The large capacity voltage converters LCVC are turned off in the standby state to conserve power, and the small capacity voltage converters SCVC are left on to be able to maintain charge on the various internal voltage lines.

In FIG. 2 is shown a voltage diagram of prior art, which reflects the operation of the voltage converters shown in FIGS. 1A and 1B. Starting in Phase I, the low powered memory chip is turned on with powering on of VDD. The standby signal is also on and comes up to full strength along with VDD by the end of Phase I. At the same time the "power-up" PU voltage is off as is the LCVC and the SCVC converters are on in Phase I. After the external memory chip voltage VDD has reached full value, Phase II, a standby phase, is started. Phase II is approximately 200 us long and is used to allow the various internal voltage to stabilize. During Phase II the system cannot issue any active memory commands since the various internal voltages are not ready and the LCVC converter is off while the SCVC converter remains on.

Continuing to refer to FIG. 2, In Phase III there are at least two dummy active commands issued to help charge the internal power lines. Phase III is approximately twice trcmin in length, where trcmin=minimum active cycle time, and the power up signal PU is activated within Phase III. Both the LCVC and the SCVC converters are on in Phase III. In Phase IV, an active phase, the standby SBY signal off and a power-up PU signal on. Both the LCVC and the SCVC converters are on and the memory chip is ready to perform normal memory operations, such as read, write and cell refresh. At the end of Phase IV the standby signal SBY is raise an the memory chip enters a standby Phase V. In Phase V the LCVC converters are off and the SCVC converters remain on supplying charge to the various internal power lines within the memory chip.

The continued demand for speed up of the operation of low power RAM memory devices necessitates finding ways to produce a low power device, which meets a stringent set of specifications, and to also provide a quick response from the low powered device used in portable applications. Improving the power-up procedure for low power RAM promotes development of portable devices containing low powered RAM.

SUMMARY OF THE INVENTION

It is an objective of the present invention to improve the power up response time of a low power memory chip while preserving the low power requirements of the chip.

It is also an objective of the present invention to improve the power up response time of low power memory chips while being brought in and out of power off mode.

It is further an objective of the present invention to provide controls that differentiates between power off, power up, active, and standby modes.

It is still further an objective of the present invention to use large capacity voltage sources internal a low power memory chip when bring-up speed is necessary.

The present invention uses large capacity LCVC and small capacity SCVC voltage converters internal to a low power memory chip to provide internal voltages and to manage a quick bring-up of the chip power from both the off state and the standby state. During an initial power on of the low power memory chip called Phase I, an external supply voltage VDD is turned on along with a standby signal SBY. During Phase I both the LCVC converters and the SCVC converters are turned on. For a time period of approximately 100 us after VDD has reach full value, called Phase II, the SBY signal remains on along with the LCVC and SCVC converters. Phase II allows for stabilization of internal memory chip voltages, and the use of the LCVC converters during Phase II eliminates the need for dummy cycles, as required with the prior art, to stabilize the internal power of the low power memory chip. The elimination of the dummy cycles reduces the time to power up the memory chip.

In the prior art, after the external power, VDD, is stable a 200 us delay prior to applying an executable command is a general specification for a low power DRAM. In addition to the 200 us delay there are some special low power RAM that needs the delay at least two dummy active commands beyond the 200 us. In the present invention, the method provided reduces the 200 us delay to less than 100 us and eliminates the dummy commands that are needed prior to applying an executable command by the prior art.

At the end of the 100 us time period of Phase II, a power up signal PU is activated, and the low power memory chip enters a standby mode, called Phase III. The power up signal PU is not activated until voltages levels of the memory chip external and internal power supplies have reach a threshold voltage level for each power supply. The threshold voltage level can be defined as a percentage of final value and can be approximately 90% of the final value.

In Phase III the LCVC converters are turned off, and the SCVC converters remain on. At some point while in standby mode the SBY signal is turned off while the PU signal remains on. This enters the memory chip into the active mode, Phase IV, where both the LCVC and SCVC converters are powered on so that memory operations, such as read, write, refresh etc., can be performed at the memory performance specifications. When the memory operations are completed the SBY signal is raised and the memory chip is again in the standby mode, Phase V, with the LCVC converters being turned off to conserve power.

Both the LCVC and the SCVC converters produce internal memory chip voltages, such as VCC the internal peripheral circuit power supply, VCCSA the sense amplifier supply voltage, VBL the bit line voltage, VPL the memory cell plate voltage, VPP the word line voltage and VBB the memory substrate voltage. The SCVC converters provide a voltage to maintain the charge state of the internal power lines of the memory chip, but the LCVC converters are required to produce enough energy to perform memory operations to specification and overcome the loading of the internal power lines. The issuance of the power up signal PU while the memory chip is in standby allows the internal power circuits to be charged up quickly which speeds up the power up procedure without the need to issue two active dummy cycle as in the prior art. Turning on the LCVC converter in parallel with the SCVC converter at the beginning of each active state, Phase IV, speeds up the charging of the internal power lines. Turning off the LCVC converters at the end of the active state leaves the SCVC converter on and conserves power since the voltage converters consume power to create the internal voltages, and the larger the capacity of the converter the more power is consumed.

BRIEF DESCRIPTION OF THE DRAWINGS

This invention will be described with reference to the accompanying drawings, wherein:

FIGS. 1A and B are block diagrams of prior art showing the relationship of internal chip voltage converters and a memory chip standby signal, FIG. 2 is a diagram of prior art showing the relationship between control voltages, supply voltages and the various power-on phases of a low power memory chip.

DETAILED DESCRIPTION OF THE PREFERRED EMBODIMENT

Figure 3:
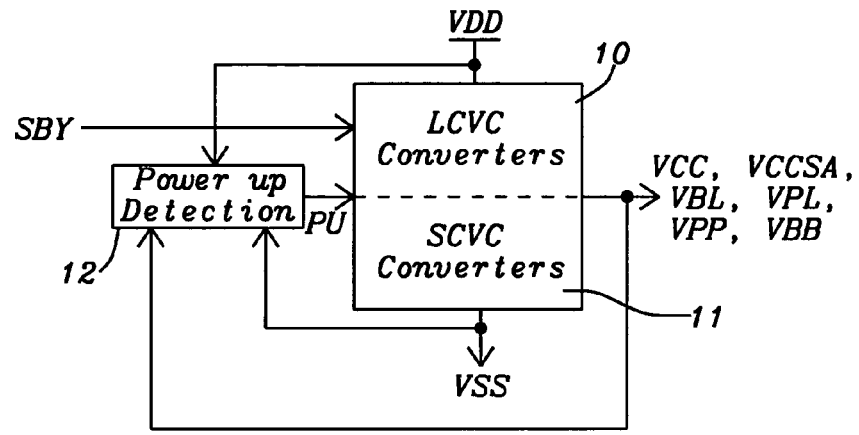
FIG. 3 is a block diagram of the present invention showing internal voltage converters and controls to provide power conservation and memory speed.

In FIG. 3 is shown a block diagram of the present invention of the voltage converters, control signals and input and output voltages that are used internal to a low power memory chip. There are two types of voltage converters, a large capacity voltage converter LCVC 10 and a small capacity voltage converter SCVC 11. The voltage converters are supplied with external chip voltages VDD, which is memory chip power, and VSS, which is memory chip ground. The voltage converters LCVC and SCVC develop and output voltages internal to the low power memory chip such as, VCC the memory peripheral circuit power supply, VCCSA the sense amplifier power supply voltage, VBL the bit line voltage, VPL the memory cell plate voltage, VPP the word line voltage and VBB the memory substrate voltage.

Continuing to refer to FIG. 3, there are two control signals, SBY and PU. The SBY signal puts the memory chip and the internal voltages into a standby state, and the PU signal puts the memory chip into a power up state. When the memory chip is first powered on and later when the memory chip is in an active state, both the LCVC 10 and the SCVC 11 are on and supplying power to the internal circuits. The power up detection function 12 determines when the external voltage VDD and the internal voltages, such as VCC, VCCSA, VBL, VPL, VPP and VBB, are each above a specified threshold level and then allows the PU signal to be applied to the voltage converters LCVC and SCVC.

Continuing to refer to FIG. 3, the two control signals SBY and PU are used together to select the different power states within which the low powered memory chip is placed. Table 1 shows the different memory states that are activated by the two control signals SBY and PU. When the memory chip is powered off, both the power up signal and the standby signal are off or at a logical "0". When the memory chip is first powered on the power up signal PU is off, logical "0", and the standby signal SBY is on, logical "1". When an active state, which is used to perform memory operations, is required, the PU signal remains on, logical "1", and the SBY signal is turned off, logical "0". For a standby state, which conserves power, both the PU and SBY signals are on, logical "1".

TABLE 1

| Power State | PU | SBY |
|---|---|---|
| Power off | 0 | 0 |
| Power up | 0 | 1 |

TABLE 1-continued

| Power State | PU | SBY |
| --- | --- | --- |
| Active | 1 | 0 |
| Standby | 1 | 1 |

Figure 4:
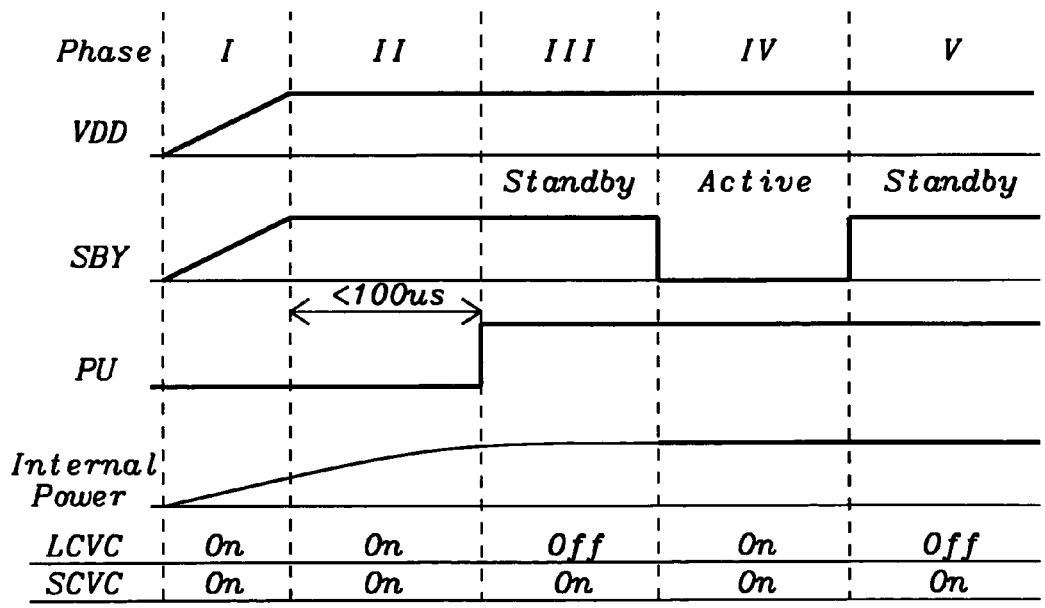
FIG. 4 is a diagram of the present invention showing the relationship between control voltages, supply voltages and the various power-on phases of a low power memory chip.

In FIG. 4 is shown a voltage diagram of the present invention, which shows the operation of the voltage converters shown in FIG. 3 through the various operating phases and power states. In Phase I power is turned on, and VDD and the standby signal SBY are ramped up. The chip internal power begins to raise. Both the large capacity voltage converters LCVC and the small capacity voltage converters SCVC are on and beginning to produce a set of internal voltages. At the end of Phase I, VDD and the standby signal SBY have stabilized and reach a final value. At this point Phase II commences and lasts for a duration of approximately 100 us. Both the LCVC and SCVC converters are on during Phase II as well as the standby signal SBY. Since the LCVC converters are on during both Phase I and II, the time to obtain stable voltages is shorter than in the prior art, and the two dummy active cycles are not necessary to stabilize the memory chip internal power supply voltage, as with the prior art. This saves a considerable amount of time.

Continuing to refer to FIG. 4, Phase II ends when the PU signal goes to a high voltage state from a low voltage state. The power up detection 12 generates a high PU voltage when all of the external and internal power voltages are larger than the respective threshold voltages of each power voltage. When both the PU signal and the standby signal SBY are on, the LCVC converter is turned off in Phase III, see Table 1. Phase III along with Phase V are memory standby states, where the LCVC converter is turned off to conserved power since the LCVC converters use more power to provide energy capacity than do the SCVC converters. At some point while the memory chip is in the standby state, a memory operation is required, and the standby signal SBY is turned off, logical "0", which turns on the LCVC converters while keeping the SCVC converters on. This is Phase IV, which is the active state of the low powered memory chip, where memory operations are performed at the specified performance. After the memory operations are completed the SBY signal is raised, commencing Phase V, where the LCVC converters are turned off and putting the chip back into a standby state to conserve power.

While the invention has been particularly shown and described with reference to preferred embodiments thereof, it will be understood by those skilled in the art that various changes in form and details may be made without departing from the spirit and scope of the invention.

What is claimed is:

1. An internal power system for a memory chip, comprising:
    a) a low power memory chip,
    b) a small capacity voltage converter,
    c) a large capacity voltage converter,
    d) a first and a second control signal,
    e) said first and second control signals control said large capacity voltage converter during power on and operation of said memory chip to provide charging capacity during bring up and memory operations of said memory chip and to conserve power during a standby state of said memory chip.

2. The power system of claim 1, wherein said small capacity voltage converter and said large capacity voltage converter supply voltages to internal circuits of said low power memory chip, which further comprise:
    a) peripheral circuit power,
    b) sense amplifier circuit power,
    c) bit line voltage,
    d) memory cell plate voltage,
    e) word line voltage,
    f) memory substrate voltage.

3. The power system of claim 1, wherein said small capacity voltage converter maintains voltage charge on internal power lines of said memory chip during said standby state.

4. The power system of claim 1, wherein said large capacity voltage converter is powered on at said power up of said memory chip to reduce power up delay and to eliminate the need for dummy cycles to stabilize internal power lines of said memory chip.

5. The power system of claim 1, wherein said first control signal is on when said memory chip is initially powered on, and said second control signal is activated after internal power lines of said memory chip stabilize, thereby placing said memory chip into said standby state and turning off said large capacity voltage converter.

6. The power system of claim 5, wherein said first control signal is turned off to initiate an active state when said second control signal is on and said chip is in said standby state.

7. The power system of claim 1, wherein said first and second control signal are both off when said memory chip is powered off and both said first and second control signals are on when said memory chip is in said standby state.

8. The power system of claim 1, wherein said first control signal is on and said second control signal is off during power up of said memory chip, and said first control signal is off and said second control signal is on during an active state of said memory chip.

9. The power system of claim 1, wherein said second control signal remains off during initial memory chip power-on until external and internal power supply voltages have reach a predetermined threshold level.

10. A method of power control for of a low power memory chip, comprising:
    a) turning on an external power of a low power memory chip,
    b) turning on a first control signal coupled to a power circuitry internal to said memory chip,
    c) turning on a small capacity voltage converter and a large capacity voltage converter which form a power source for said power circuitry,
    d) waiting an amount of time after said external power has stabilized and reached final value, and issuing a second control signal which places said memory chip into a standby state,
    e) turning off said first control signal while said memory chip is in said standby state, which places said memory chip into an active state,
    f) turning on said first control signal while said memory chip is in said active state, which places said memory chip in said standby state.

11. The method of claim 10, further comprising monitoring of said power circuitry internal to said memory chip to insure minimum acceptable voltage levels have been attained on said power circuitry prior to issuing said second control signal.

12. The method of claim 10, wherein said large capacity voltage converter charges said power circuitry to greater than predetermined voltage levels during said amount of time.

13. The method of claim 10, wherein said amount of time is less than approximately 100 microseconds.

14. The method of claim 10, wherein said small capacity voltage converters maintain charge on said power circuitry when said memory chip is placed into the standby state.

15. The method of claim 10, wherein said large capacity voltage converter is used to provide sufficient energy to perform memory operations to meet said low power memory chip specifications during said active state.

16. The method of claim 10, wherein said large capacity voltage converter is turned off during said standby state to conserve power.

17. The method of claim 10, further comprises turning off both the first control signal and the second control signal when said low power memory chip is turned off.

18. A power circuit for a low power memory chip, comprising:
  a) a means for controlling a power source internal to a low power memory chip to provide a high capacity to charge internal power circuits during power up of said memory chip,
  b) a means for controlling said power source to conserve power in a standby state,
  c) a means for controlling said power source to provide said high capacity in an active state when memory operations are performed,
  d) a means for switching between said active and said standby states.

19. The power circuit of claim 18, wherein said means for controlling said power source to provide said high capacity during said power up is by a standby control signal being on at initial power on of the memory chip, which allows the bring up of a large capacity voltage converter to supply internal memory chip voltages.

20. The power circuit of claim 18, wherein said means for controlling said power source to conserve power in said standby state is by issuing a power up control signal which is activated after voltages of said memory chip have stabilized.

21. The power circuit of claim 20, wherein said means for controlling said power source to conserve power in said standby state after initial bring up of said memory chip includes a monitor of voltages of said memory chip to verify that external and internal power have reach a predetermined level before issuing said power up control signal.

22. The power circuit of claim 20, wherein said means for controlling said power source to conserve power in said standby state turns off a large capacity voltage converter and leaves on a small capacity voltage converter to supply memory chip internal voltages.

23. The power circuit of claim 18, wherein said means for controlling said power source to provide said high capacity during an active state of said memory chip is by the turning off of said standby control signal, which turns on a high capacity voltage converter.

24. The power circuit of claim 23, wherein said means for controlling said power source to provide said high capacity during said active state turns on said high capacity voltage converter in parallel with a small capacity voltage converter.

25. The power circuit of claim 23, wherein said means for switching between said active and said standby states is by turning on said standby signal when in the active state to switch to said standby state, and turning off said standby signal when in the standby state to switch to said active state.

* * * * *